US006116950A

United States Patent [19]

Koseki

[11] Patent Number: 6,116,950

[45] Date of Patent: Sep. 12, 2000

[54] STAND-OFF FOR MEMORY CARD CONNECTOR

[75] Inventor: Yoshitsugu Koseki, Nagona, Japan

[73] Assignee: Hon Hai Precision Ind. Co., Ltd., Taipei Hsien, Taiwan

[21] Appl. No.: 09/328,886

[22] Filed: Jun. 9, 1999

[30] Foreign Application Priority Data

Nov. 20, 1998 [TW] Taiwan ................................ 87219262

[51] Int. Cl.[7] .............................. H01R 13/60; H05K 1/00

[52] U.S. Cl. ............................................ 439/541.5; 439/67

[58] Field of Search .................................... 439/64, 541.5

[56] References Cited

U.S. PATENT DOCUMENTS 6,045,366 4/2000 Motomu .................................... 439/64

*Primary Examiner*—Michael L. Gellner
*Assistant Examiner*—Mahmoud Anway A. Mohamed
*Attorney, Agent, or Firm*—Wei Te Chung

[57] ABSTRACT

A stand-off for mounting a PCMCIA connector having two vertically stacked shells to a mother board. The stand-off is attached to a side of each shell and comprises a main plate and a plurality of flanges extending from upper and lower edges thereof. A pair of locking protrusions extends from opposite edges of the main plate for attaching the stand-off to the shell. A tab defining a screw hole perpendicularly extends form a front portion of the main plate. The connector is attached to the mother board by means of bolts. A spacer is provided between the tab and the mother board to ensure that the connector is positioned parallel to the mother board. The vertical position of the connector is dependent on the length of the spacer and the position of the mother board.

20 Claims, 12 Drawing Sheets

STAND-OFF FOR MEMORY CARD CONNECTOR

BACKGROUND OF THE INVENTION

The present invention relates to a PCMCIA connector, and more particularly to a stand-off of a PCMCIA connector which is versatile in mounting the connector with respect to a mother board.

As notebook computers become further developed, an increasing number of electrical cards are used to expand the memory of the computer, increase input/output functions and enhance the capabilities of the internal hardware. Thus electrical card connectors are necessary for interfacing between the computer and the electrical cards. Most electrical card connectors are designed to be in line with the standards set forth the by PCMCIA. At present, no set conditions exist for positioning the electrical card connector on a mother board of the computer.

To prevent inclination of the electrical card connector with respect to the mother board, stand-offs are commonly used such as those disclosed in Taiwan patent application Nos. 82211048, 83208932, 86210606, and U.S. Pat. Nos. 5,275,573; 5,451,168; 5,490,791 and 5,591,047. With reference to FIG. 1 of the attached drawings, a PCMCIA connector 6 includes a shell 60 defining slots 62 therethrough and a stand-off 61. A pair of channeled protrusions 63 inwardly extends toward each other from upper and lower sides thereof. The protrusions 63 are retained in the corresponding slots 62 of the shell 60. A lower portion 64 of the stand-off 61 is outwardly bent and a screw-hole 65 is defined therethrough.

Referring to FIG. 2, a card connector 7 includes a stand-off 8 forming a cylindrical lower portion 82, an upper portion 81 of reduced diameter, and a screw-hole 83 defined therethrough. An engaging screw-hole 71 is defined in the connector 7 for interferentially receiving the upper portion 81. The stand-off bolt 8 is attached to a mother board by means of a bolt/nut assembly.

Referring to FIG. 3, a stand-off (a) attaches a shell (b) to a mother board (c) of a computer. The stand-off for the electrical card connector is only attached to the mother board, thus the stand-off cannot reduce the overall height of the connector and space conservation is not promoted. Furthermore, the conventional stand-off for an electrical card connector is a single element serving only one function. Thus, other necessary functional portions must be attached to the card connector thereby further increasing the space occupied by the connector.

An object of the invention is to provide a stand-off for attaching an electrical card connector at a predetermined vertical position with respect to a mother board thereby reducing the overall space occupied by the card connector within the computer.

Another object of the present invention is to provide a stand-off attached to an electrical card connector, wherein a channel is defined therebetween for receiving a push bar of a card ejection mechanism thereby promoting an efficient utilization of space.

BRIEF SUMMARY OF THE INVENTION

Accordingly, an electrical card connector includes two vertically stacked shields and a stand-off of the present invention is attached to a side of each shell. Each stand-off comprises a main plate and a plurality of flanges extending from upper and lower edges thereof. A pair of lacking protrusions extends from opposite edges of the plate for attaching the stand-off to the shell. A channel is defined between the stand-off and the corresponding shield for receiving a push bar of a card ejection mechanism. A tab perpendicularly extends from a front portion of the main plate. The distance between the tab and a top edge of the main plate is less than the height of the connector. A screw hole is defined in the tab and threadedly engages with a bolt to attach the connector to a mother board. A spacer of predetermined length is provided between the screw hole and the bolt whereby the connector can be attached to the mother board at a position which promotes an efficient use of space.

DETAILED DESCRIPTION OF THE INVENTION

Figure 1:
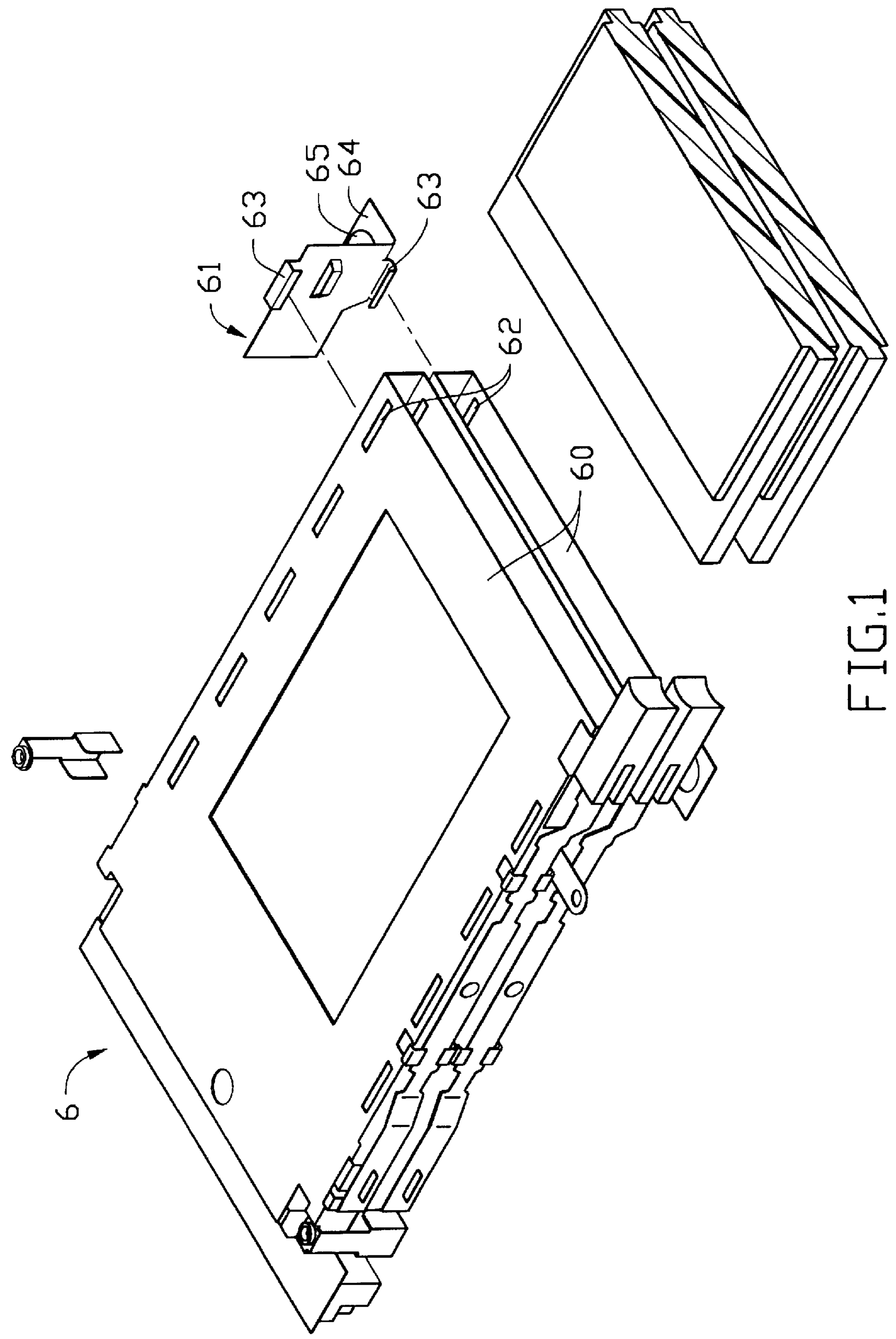
FIG.1 (PRIOR ART)
FIG. 1 is an exploded view of a PCMCIA connector and one type of conventional stand-off used therewith.
Figure 2:
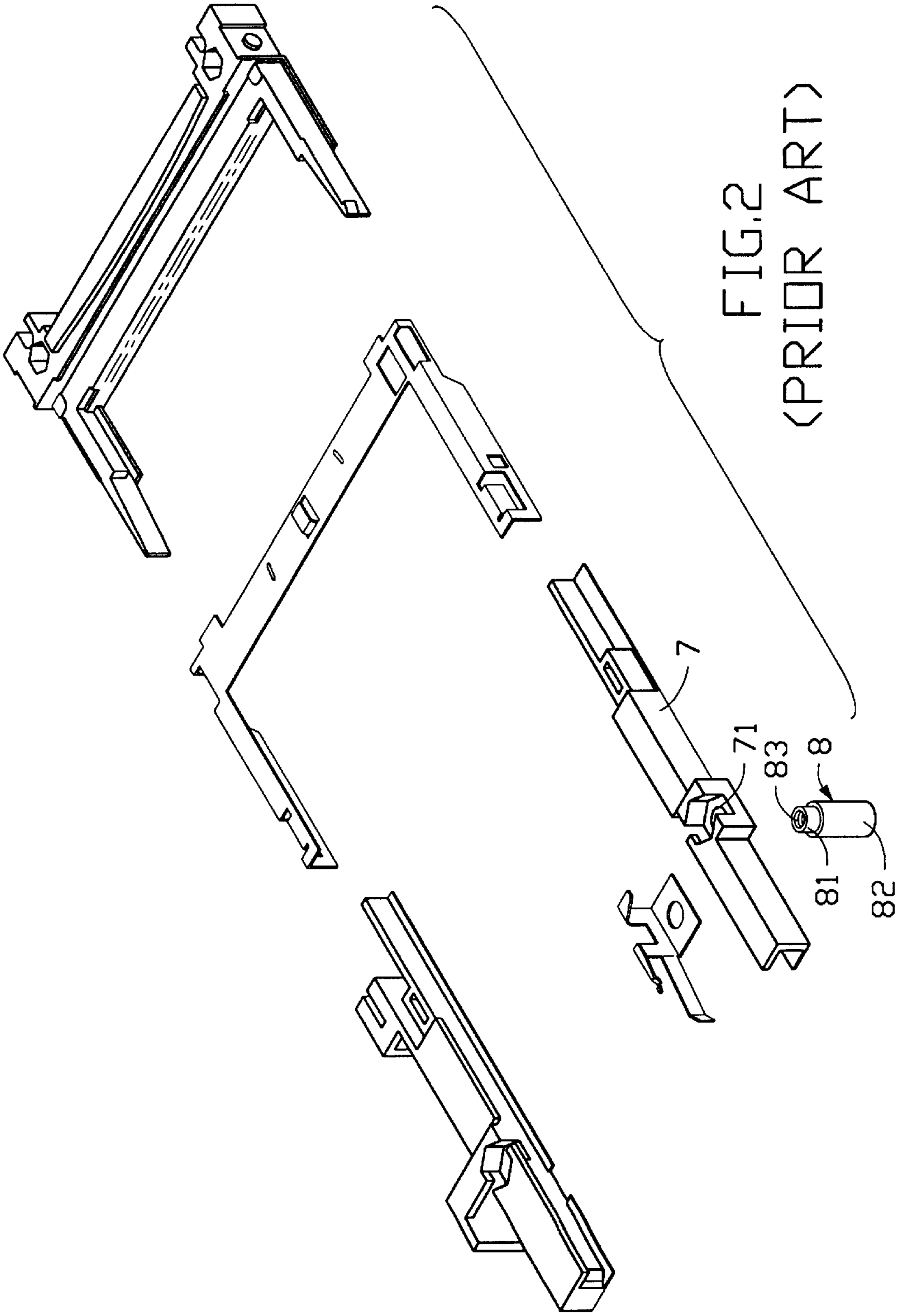
FIG.2 (PRIOR ART)
FIG. 2 is an exploded view of a card connector and another type of conventional stand-off used therewith.
Figure 3:
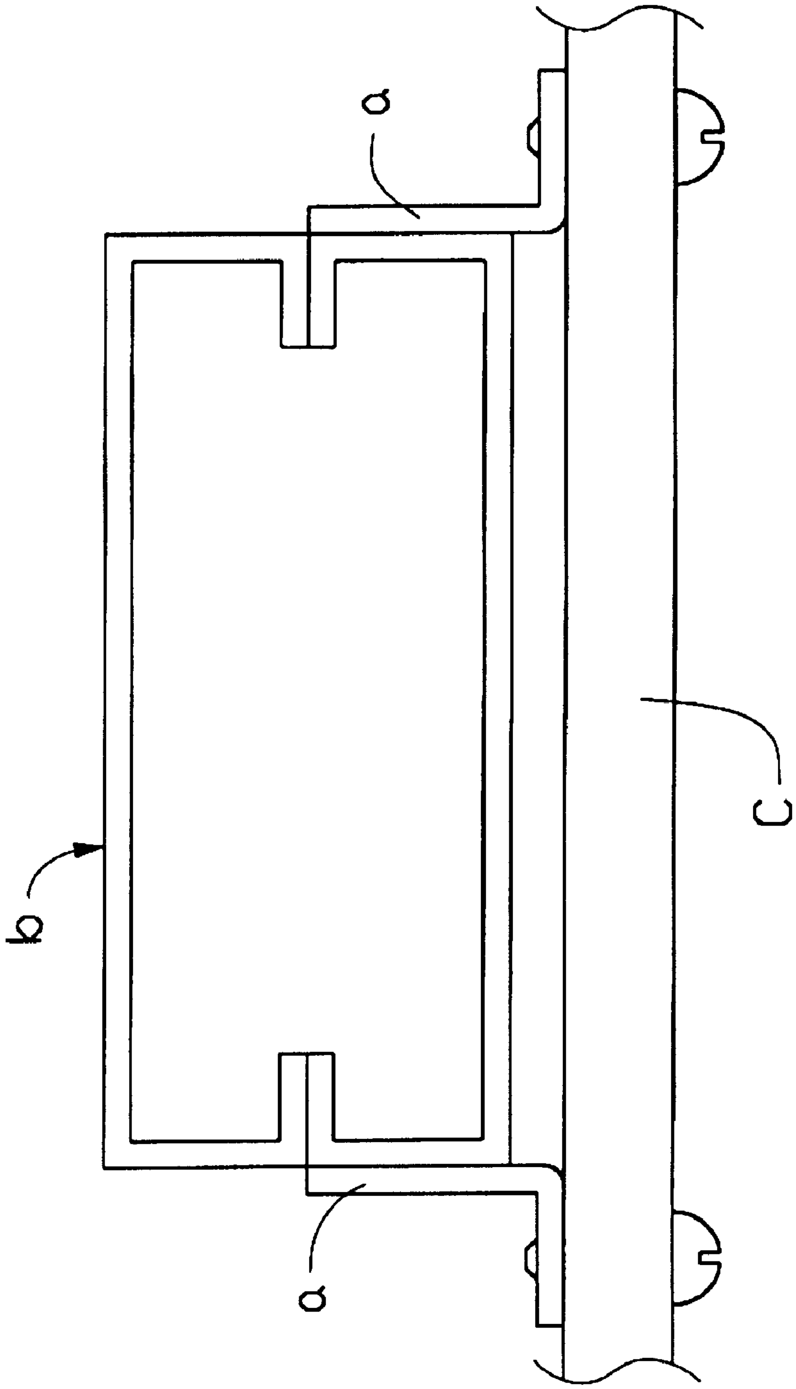
FIG.3 (PRIOR ART)
FIG. 3 is a schematic view of two vertically stacked card connector shields and a conventional stand-off used therewith.
Figure 4:
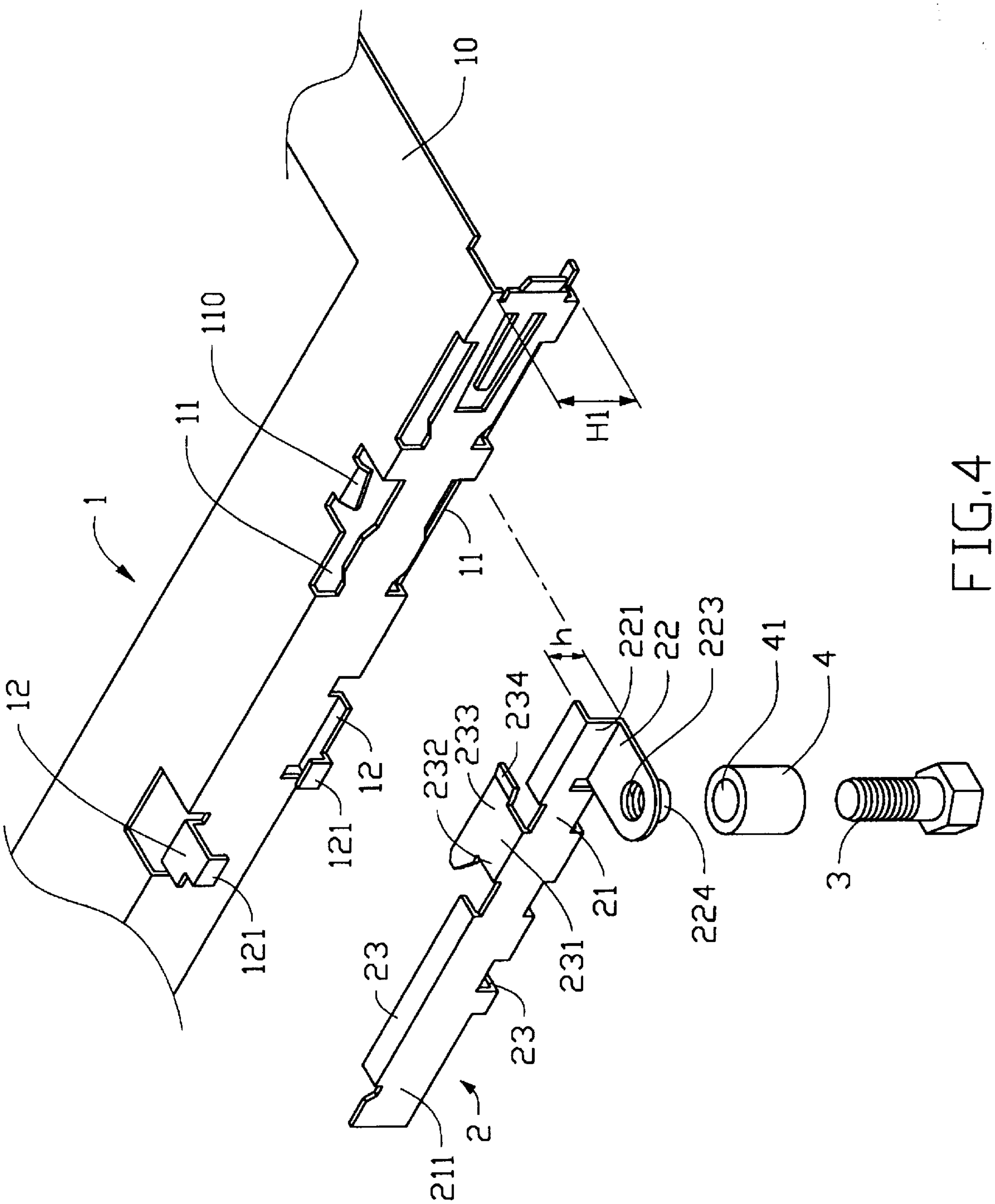
FIG. 4 is a partial, exploded view of a stand-off for a PCMCIA connector and a shell of the connector in accordance with a first embodiment of the present invention.

With reference to FIG. 4, a stand-off 2 for a PCMCIA connector 1 is attached to a side of a shell 10 of the connector 1 by means of a bolt 3 and a spacer 4. Two retaining arms 12 horizontally extend from opposite edges of the side of the shell 10. Each arm 12 forms a perpendicularly bent and inwardly extending free end 121. A pair of engaging slots 11 is defined in the opposite edges of the side of the shell 10. An abutting protrusion 110 extends into each engaging slot 11.

Figure 6:
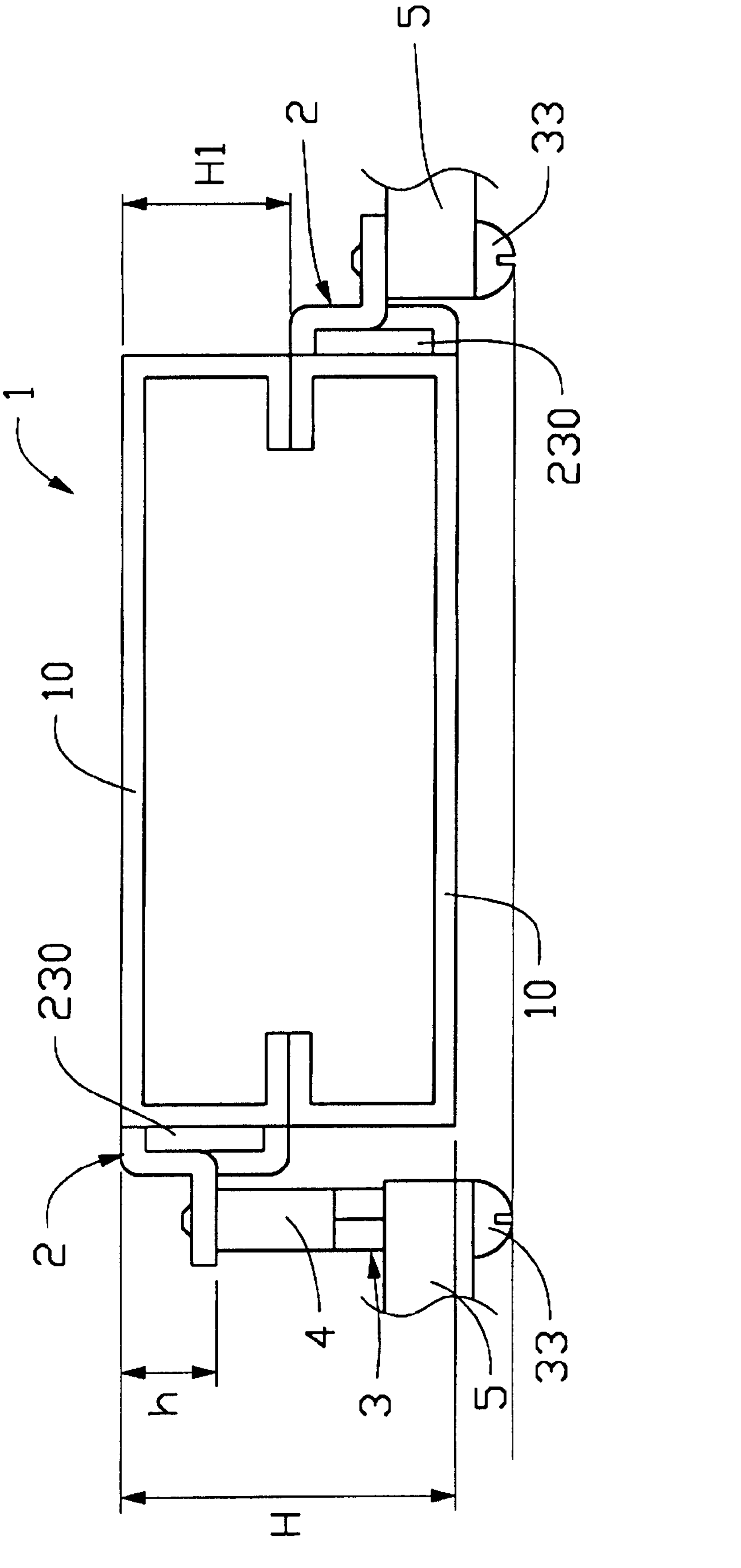
FIG. 6 is a side view of a PCMCIA connector showing how the stand-offs of the present invention attach the connector to a mother board.

The stand-off 2 comprises a main plate 21 and a tab 22 perpendicularly extending from a bottom edge of the plate 21 proximate a front end 221 thereof. The distance h between the tab 22 and a top edge of the main plate 21 is less than a height H1 of the shell 10. A cylindrical protrusion 224 downwardly extends from the tab 22. A screw hole 223 is defined through the tab 22 and the protrusion 224 for threadedly engaging with the bolt 3 to mount the connector 1 to a mother board 5 (FIG. 6). The standoff 2 is so arranged that by using the spacer 4 and the bolt 3 extending through the spacer 4 to threadedly engage with the screw-hole 223 in the tab 22, the height H of the standoff 2 can be increased to support the upper connector of a stacked card connector assembly 1 on a PC board by providing a different type of spacer 4, without the necessity to provide a different type of standoff 2 in order to support the upper connector, as will be clear from the following description. There is a screw hole 32 in the head of the bolt 3, so that another bolt 33 extends through the mother board to engage with the screw hole of the bolt 3. A pair of bent section 23 perpendicularly extends from the opposite edges of the plate 21. A pair of locking protrusions 231 perpendicularly extends from opposite edges of a middle portion of the plate 21. Each locking protrusion 231 comprises a connecting section 232 extending from the plate 21, an engaging section 233 outwardly protruding from an end of the connecting section 232, and an engaging protrusion 234 extending slightly outward from a free end of the engaging section 233.

Figure 5:
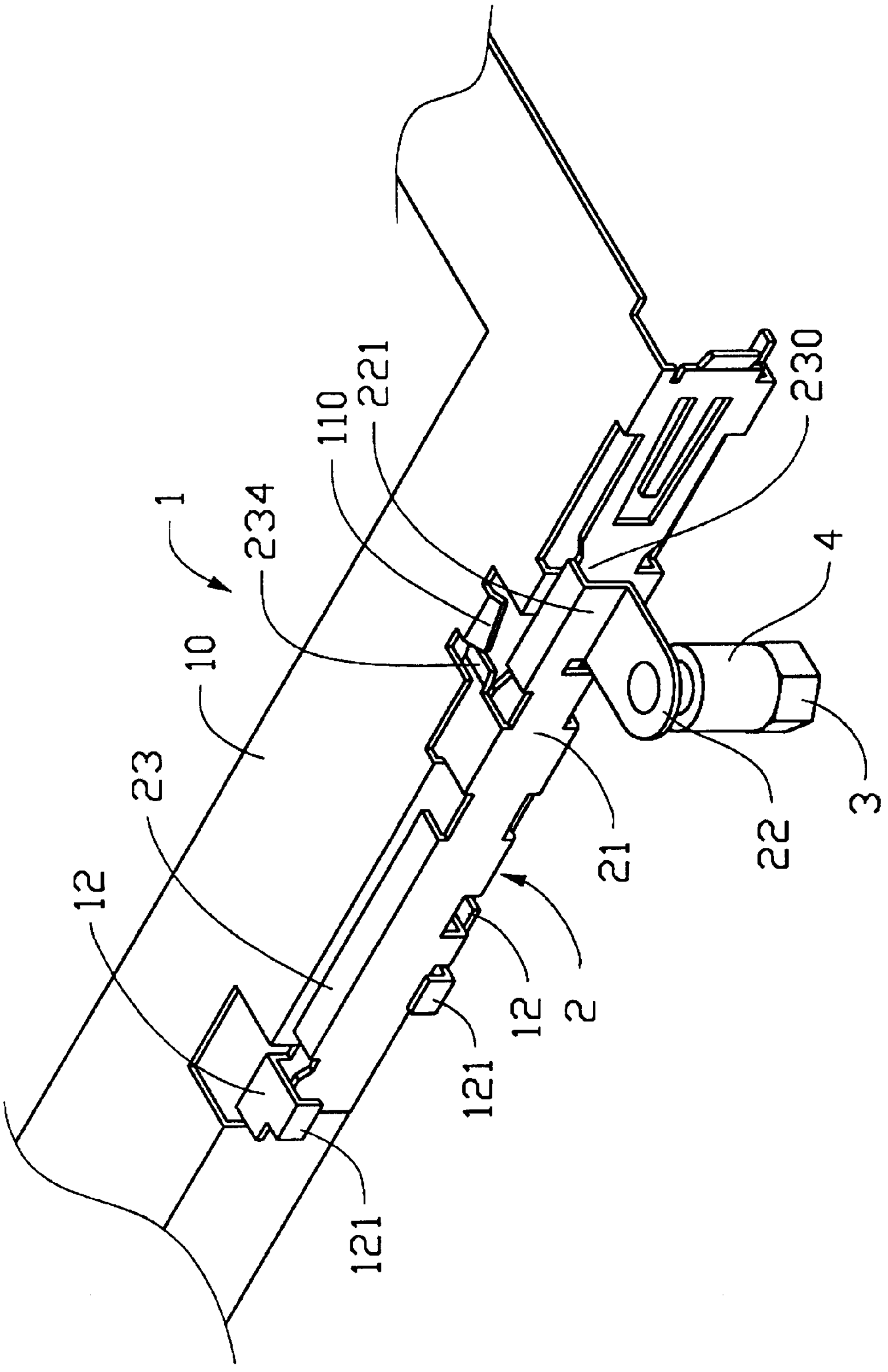
FIG. 5 is an assembled view of FIG. 4.

Also referring to FIGS. 5 and 6, the stand-off 2 is attached to the shell 10 of the connector 1 by inserting a rear end 211 of the plate 21 between the two arms 12 to prevent it from coming off. The engaging sections 233 of the locking portion 231 extend through the corresponding engaging slots 11 and the engaging protrusion 234 abut against the abutting protrusions 110. Thus, the locking portions are securely retained in the corresponding engaging slots 11. A channel 230 is defined between the stand-off 2 and the shell 10 for receiving a push bar of a card ejection mechanism (not shown). The spacer 4 is positioned to snugly receive the cylindrical protrusion 224 of the tab 22 in a hole 41 defined therethrough. Since the height of the spacer 4 is selected to attach the connector 1 at a predetermined position with respect to the mother board 5, the space occupied by the connector 1 can be efficiently utilized.

Specifically reference to FIG. 6, two vertically stacked shells 10 form the connector 1. Two stand-offs 2 are respectively attached to the two shells 10 on opposite sides thereof whereby the stand-offs 2 are offset from each other. The spacer 4 is attached to the stand-off 2 of the upper shell 10 to compensate for the difference in height between the stand-offs 2 and ensure that the connector 1 is positioned parallel to the mother board 5.

Figure 7B:
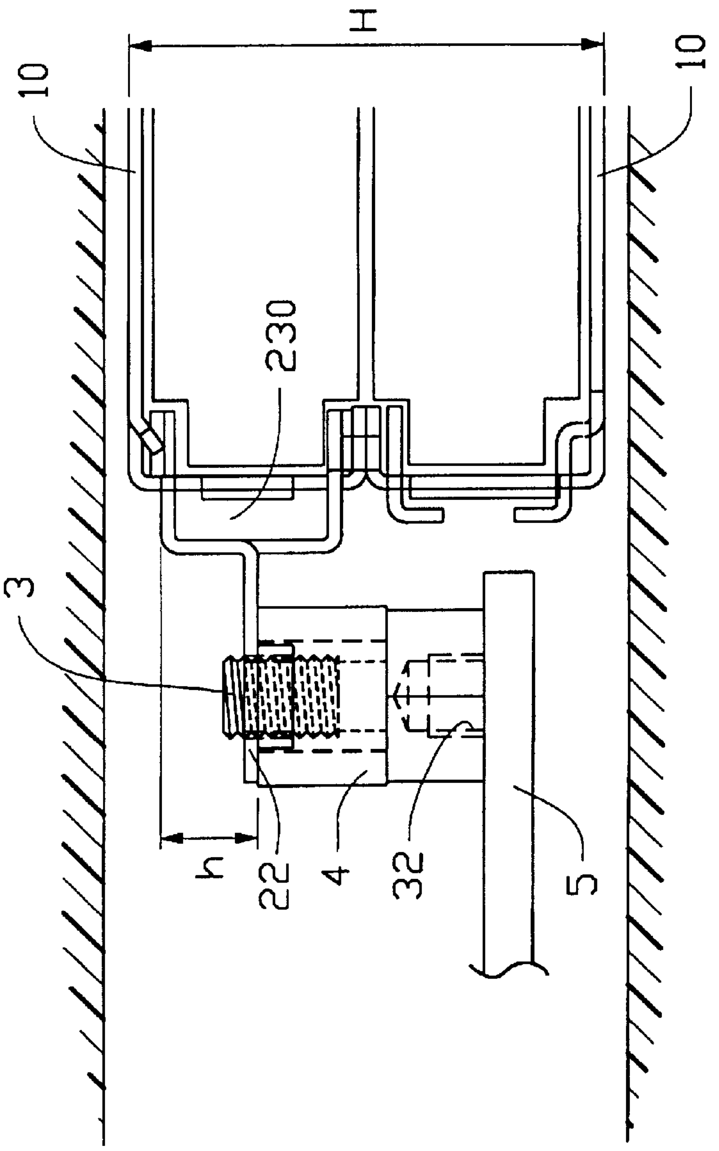
FIG. 7B is a partial, cross-sectional view of the PCMCIA connector showing how the stand-off of the present invention attaches the connector to the mother board within a computer housing.
Figure 7A:
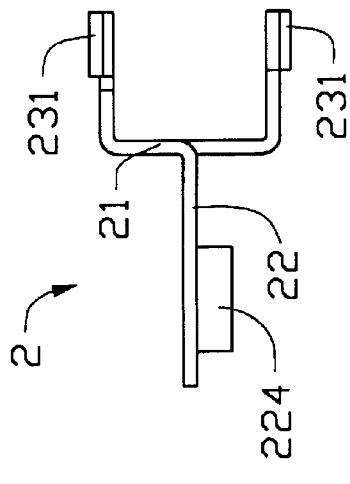
FIG. 7A is a side view of the stand-off of the present invention.

With reference to FIGS. 7A and B, the tab 22 is about in the middle of the front end 221 and the distance h between the tab 22 and the upper edge of the plate 21 is less than the height H of the stacked shells, whereby the vertical position of the connector 1 is dependent on the length of the spacer 4 and the position of the mother board 5. There is a screw hole 32 in the bolt 3, another bolt 33 extends through the mother board and engages with the bolt 3.

Figure 8:
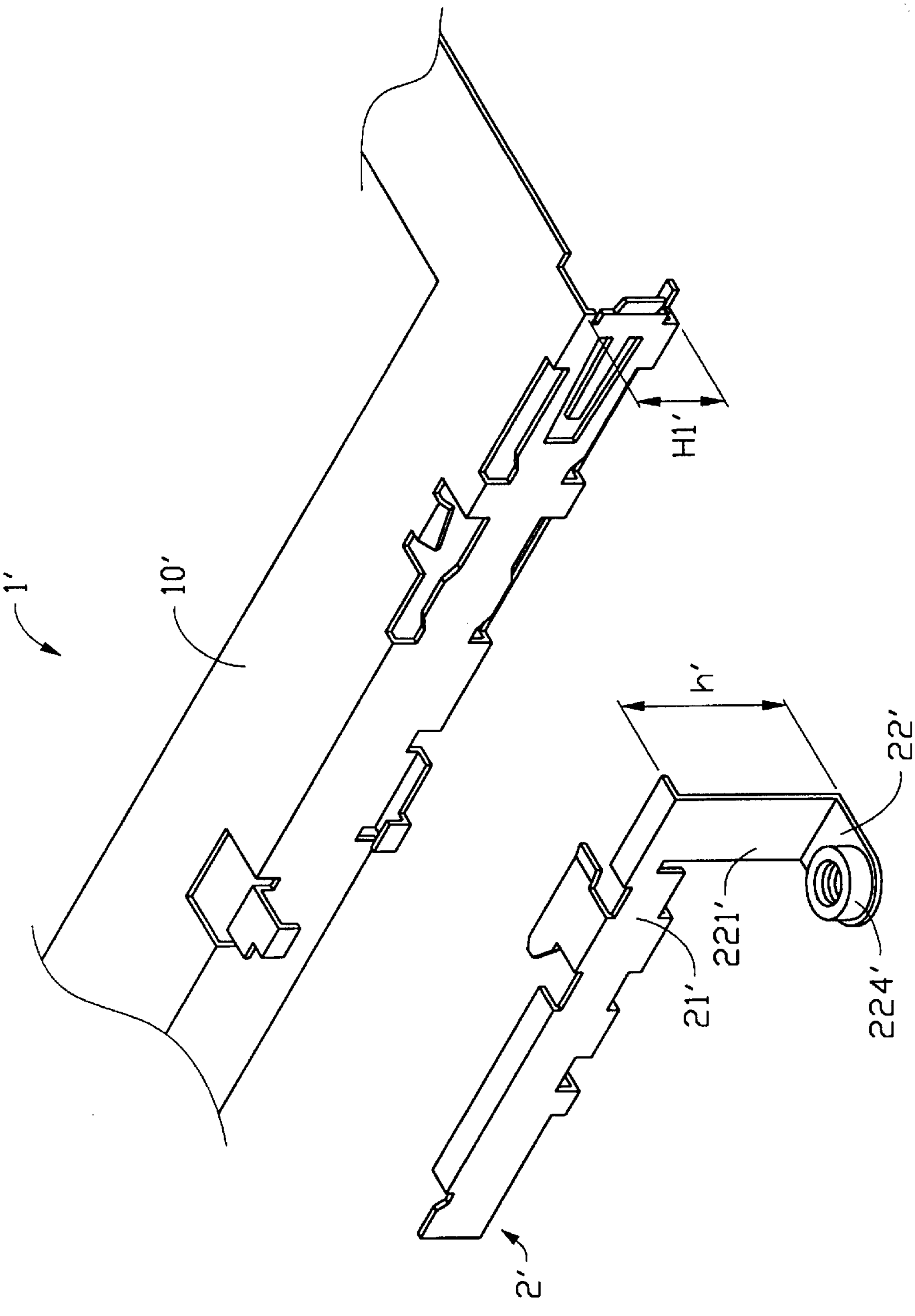
FIG. 8 is a partial, exploded view of a stand-off for a PCMCIA connector and a shell of the connector in accordance with a second embodiment of the present invention.

With reference to FIG. 8, a second embodiment of a stand-off 2' and a connector 1' comprising a shell 10' are shown. The stand-off 2' is attached to a side of the shell 10' which has a similar structure as the shell 10 of the first embodiment with the following exceptions. The tab 22' is about in the end of the front end 221'. The front end 221' is downwardly extended whereby the distance h' between a tab 22' and an upper edge of a main plate 21 is longer than the same distance h of the first embodiment. In addition, the distance h' is longer than the height H1 of the shell 10'. Furthermore, a cylindrical protrusion 224' is formed on a top surface of the tab 22.

Figure 9:
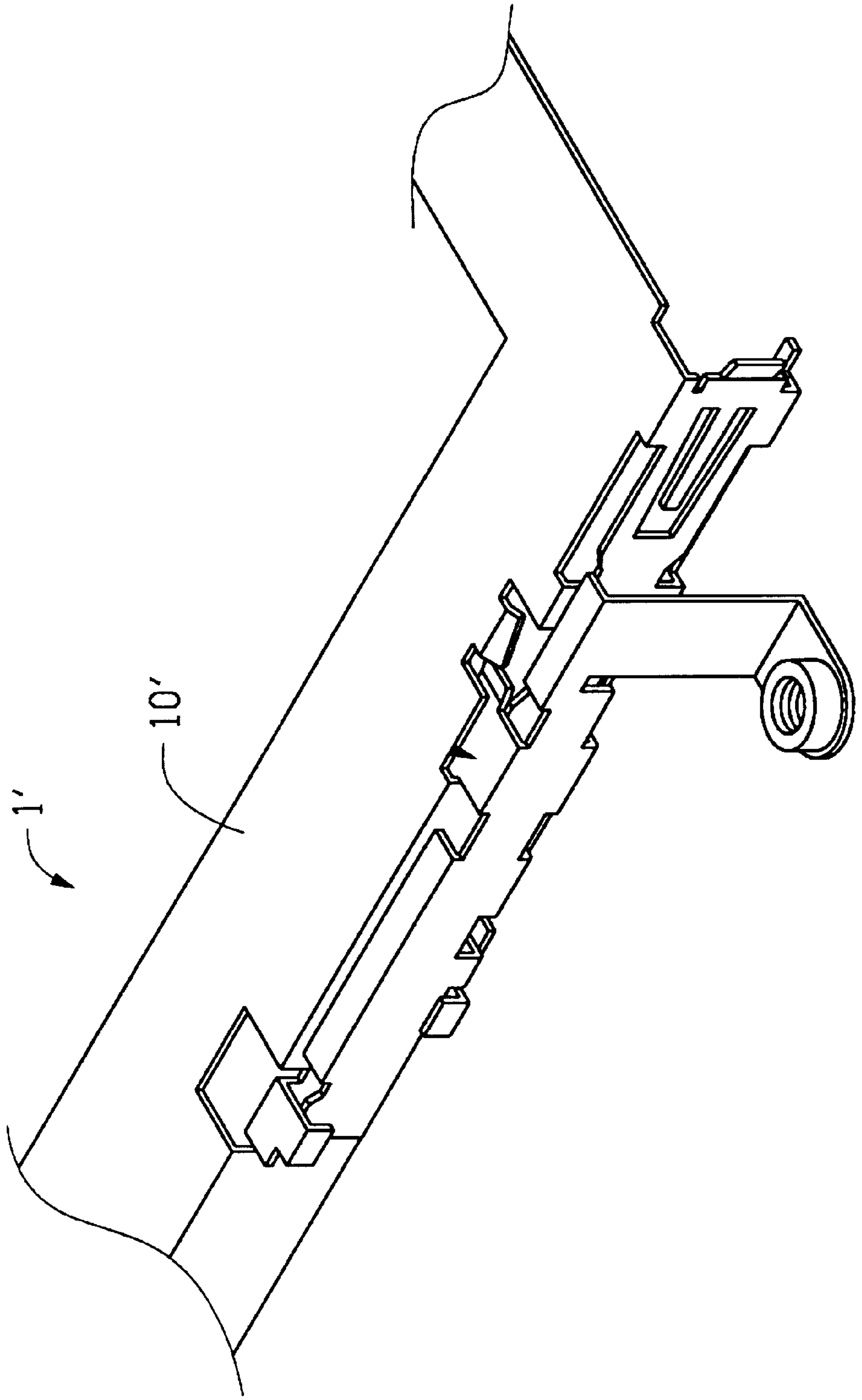
FIG. 9 is an assembled view of FIG. 8.
Figure 10:
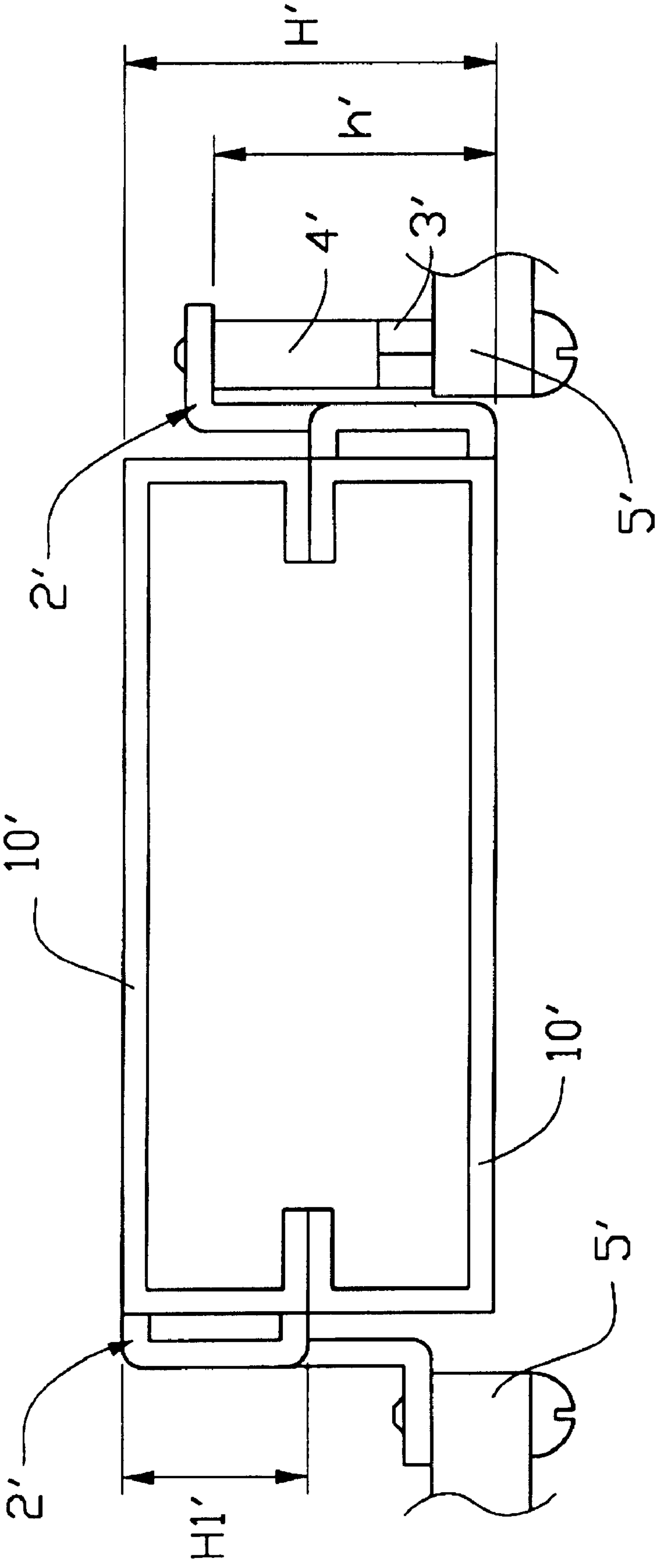
FIG. 10 is a side view of a PCMCIA connector showing how the standoffs of the present invention attach the connector to a mother board.

With reference to FIGS. 9 and 10, two stand-offs 2' are respectively attached to one of two stacked shells 10' on opposite sides thereof whereby the stand-offs 2' are offset from each other. The connector 1 is mounted to the mother board 5' by means of bolts 3' and a spacer 4'. The spacer 4' compensates for the difference in height between the stand-offs 2' and ensures that the connector l' is positioned parallel to the mother board 5'.

Figure 11B:
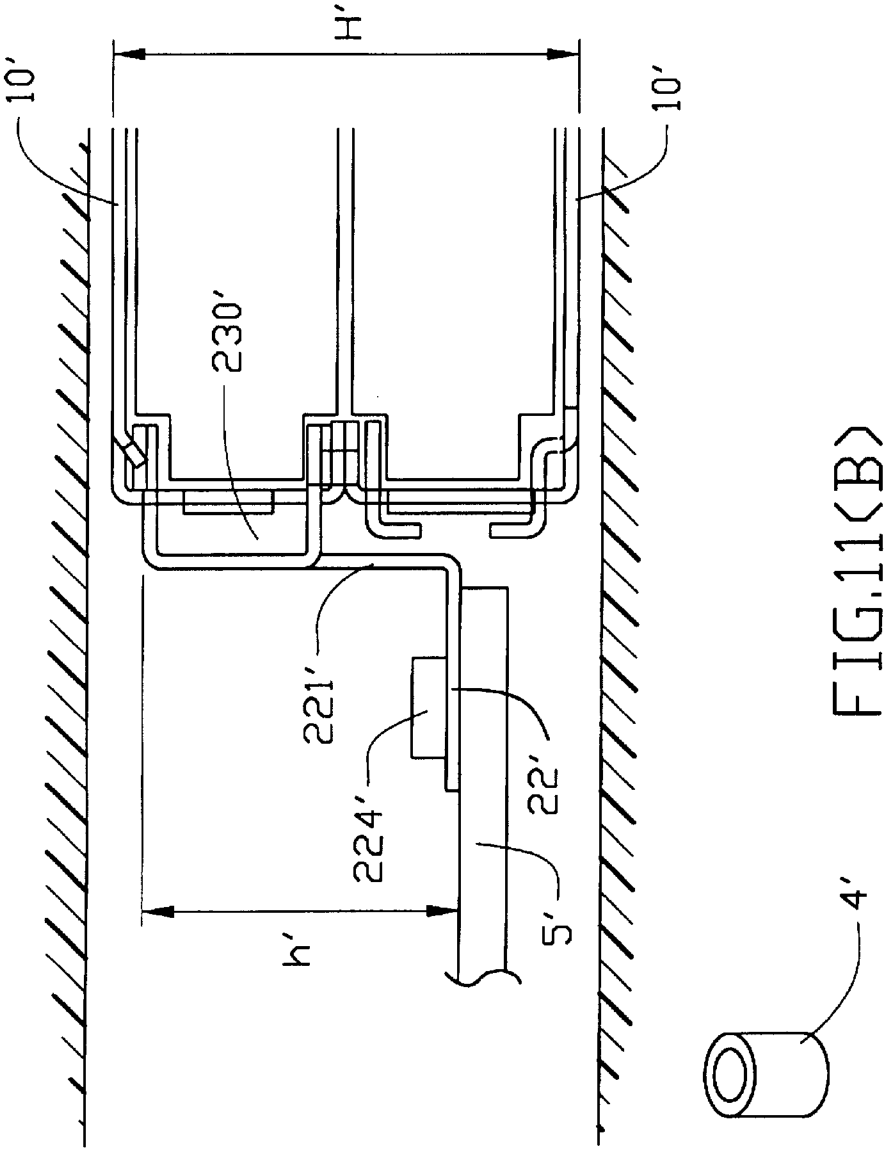
FIG. 11B is a partial cross-sectional view of the PCMCIA connector showing how the stand-off of the present invention attaches the connector to the mother board within a computer housing.
Figure 11A:
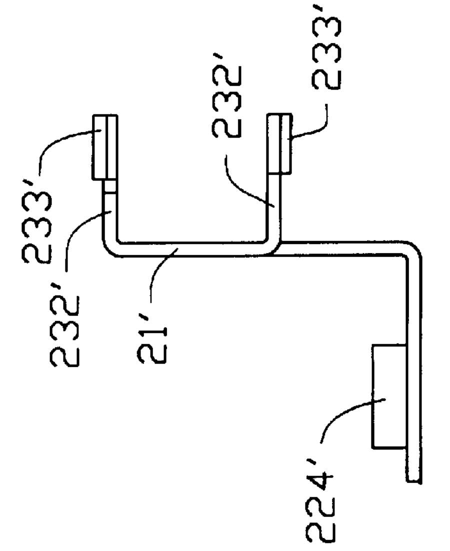
FIG. 11A is a side view of the stand-off of the present invention.

With reference to FIGS. 11A and B, the tab 22' is in the end of the front end 221', and the length h' between the tab 22' and the upper edge of the plate 21' is less than the height H' of the stacked shells 10' whereby the vertical position of the connector 1' is dependent on the length of the spacer 4' and the position of the mother board 5'.

Figure 12:
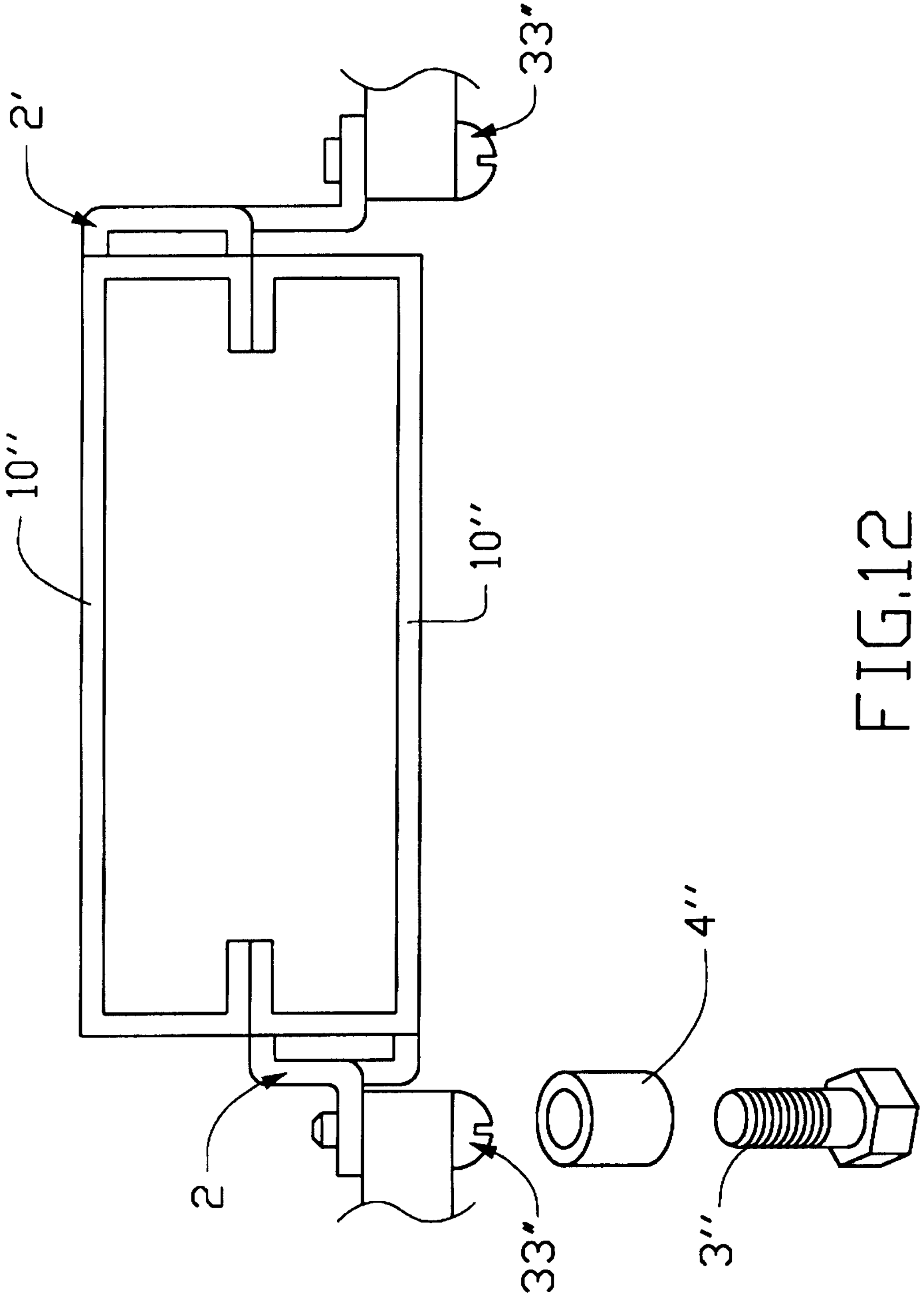
FIG. 12 is a side view of a PCMCIA connector showing how stand-offs in accordance with a third embodiment of the present invention attach the connector to a mother board.

With reference to FIG. 12, the stand-off 2 of the first embodiment is attached to a lower metal shell 10" and the stand-off 2' of the second embodiment is attached to an upper metal shell 10". The vertical position of the assembly can be adjusted by bolts 3" and a spacer 4".

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A stand-off arrangement for an electrical connector, comprising:

a shell having a pair of engaging slots:

a stand-off having a main plate, a pair of bent sections on two opposite sides of the main plate, a pair of locking protrusions intermediate the bent sections and substantially vertically extending from the main plate, and a tab substantially vertically extending from the main plate opposite the pair of locking protrusions, each locking protrusion being secured in the corresponding engaging slot, the pair of bent sections abutting the shell to space the main plate a distance from the shell, the tab having a screw hole;

a spacer having a predetermined height; and a bolt having a threaded end extending through the spacer to engage with the screw hole of the tab.

2. The stand-off arrangement as claimed in claim 1, wherein the tab is disposed to perpendicularly extend from a front end of the main plate at substantially a middle thereof.

3. The stand-off arrangement as claimed in claim 1, wherein the tab is spaced from the electrical connector a predetermined distance.

4. The stand-off arrangement as claimed in claim 1, wherein the spacer has a hollow center and a cylindrical protrusion is formed on a bottom surface of the tab, the cylindrical protrusion having a diameter less than the inner diameter of the spacer.

5. The stand-off arrangement as claimed in claim 1, wherein the bolt has a screw hole at an end opposite the threaded end.

6. The stand-off arrangement as claimed in claim 1, wherein two retaining arms extend from opposite edges of the shell each retaining arm forming a perpendicularly bent and inwardly extending free end for retaining a rear end of the main plate therebetween for preventing detachment of the main plate from the shell.

7. The stand-off arrangement as claimed in claim 1, wherein the pair of locking protrusions extends from opposite edges of the plate and each locking protrusion is retained in a corresponding engaging slot.

8. The stand-off arrangement as claimed in claim 7, wherein each locking protrusion comprises a connecting section perpendicularly extending from the plate, an engaging section outwardly protruding from an end of the connecting section, and an engaging protrusion extending slightly outward from a free end of the engaging section.

9. The stand-off arrangement as claimed in claim 8, wherein an abutting protrusion extends into each engaging slot for abutting against the engaging protrusion of the connecting section.

10. A stand-off assembly for a stacked electrical connector, comprising:

two shells each having a pair of engaging slots:

two stand-offs each having a main plate, a pair of bent sections on opposite sides of the main plate, a pair of locking protrusions intermediate the bent sections and substantially vertically extending from the main plate, and a tab substantially vertically extending from the main plate opposite the pair of locking protrusions, each locking protrusion being secured in the corresponding engaging slot, the pair of bent sections abutting the shell to space the main plate a distance from the shell, the tab having a screw hole;

at least one spacer having a predetermined height; and at least one bolt having a threaded end extending through the corresponding spacer to engage with the screw hole of the tab.

11. The stand-off assembly as claimed in claim 10, wherein the connector comprises two vertically stacked shells having a similar structure, and wherein two stand-offs are respectively attached to the two shells on opposite sides thereof.

12. The stand-off arrangement as claimed in claim 10, wherein each tab is disposed to perpendicularly extend from a front end of the corresponding main plate at substantially a middle portion thereof.

13. The stand-off assembly as claimed in claim 10, wherein each tab is spaced from the electrical connector a predetermined distance.

14. The stand-off assembly as claimed in claim 10, wherein each spacer has a hollow center and a cylindrical protrusion is formed on a bottom surface of the corresponding tab, the cylindrical protrusion having a diameter less than the inner diameter of the spacer.

15. The stand-off assembly as claimed in claim 10, wherein each bolt has a screw hole at an end opposite the threaded end.

16. The stand-off assembly as claimed in claim 10, wherein two retaining arms extend from opposite edges of each shell each retaining arm forming a perpendicularly bent and inwardly extending free end for retaining a rear end of the corresponding main plate therebetween for preventing detachment of the main plate from the shell.

17. The stand-off assembly as claimed in claim 10, wherein each of the two pairs of locking protrusions extends from opposite edges of the corresponding plate, and each locking protrusion is retained in a corresponding engaging slot.

18. The stand-off assembly as claimed in claim 17, wherein each locking protrusion comprises a connecting section perpendicularly extending from the corresponding plate, an engaging section outwardly protruding from an end of the connecting section, and an engaging protrusion extending slightly outward from a free end of the engaging section.

19. The stand-off assembly as claimed in claim 18, wherein an abutting protrusion extends into each engaging slot for abutting against the engaging protrusion of the connecting section.

20. A structure of a combination of an electrical connector comprising:

a shell;

a stand-off defining a vertical main plate, a pair of bent sections horizontally extending therefrom toward said shell;

means for securing said stand-off to said shell with a space remaining between the stand-off and the shell for receiving therein a push bar of ejection mechanism of the connector; and a mounting tab horizontally extending from the main plate away from the bent sections and adapted to optionally cooperate with a spacer to properly adjustably mount the connector with regard to a printed circuit board.

* * * * *